United States Patent
Chou et al.

(10) Patent No.: US 10,527,675 B2
(45) Date of Patent: Jan. 7, 2020

(54) MOTOR DRIVING DEVICE AND MEASURING METHOD

(71) Applicant: FANUC CORPORATION, Yamanashi (JP)

(72) Inventors: Norihiro Chou, Yamanashi-ken (JP); Youichirou Ooi, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/207,629

(22) Filed: Dec. 3, 2018

(65) Prior Publication Data

US 2019/0178941 A1    Jun. 13, 2019

(30) Foreign Application Priority Data

Dec. 7, 2017    (JP) .................................. 2017-235013

(51) Int. Cl.
*G01R 31/34* (2006.01)
*G01R 27/08* (2006.01)
*G01R 27/02* (2006.01)

(52) U.S. Cl.
CPC ......... *G01R 31/343* (2013.01); *G01R 27/025* (2013.01); *G01R 27/08* (2013.01)

(58) Field of Classification Search
CPC .... G01R 31/14; G01R 31/025; G01R 31/343; G01R 31/346; G01R 27/06; G01R 27/08;

(Continued)

(56) References Cited

U.S. PATENT DOCUMENTS

| 6,078,173 A | 6/2000 | Kumar et al. |
| 7,898,264 B2 * | 3/2011 | Horikoshi ......... G01R 31/1263 324/547 |

(Continued)

FOREIGN PATENT DOCUMENTS

| JP | 2001-116781 A | 4/2001 |
| JP | 2007-333465 | 12/2007 |

(Continued)

OTHER PUBLICATIONS

Decision to Grant a Patent issued by the Japanese Patent Office in relation to Japanese Application No. 2017-235013 dated Jul. 2, 2019 (3 pages) along with English language translation (2 pages).

*Primary Examiner* — Minh N Tang
(74) *Attorney, Agent, or Firm* — Robert P. Michal, Esq.; Carter, DeLuca & Farrell LLP

(57) ABSTRACT

A motor driving device includes: an insulation resistance measuring unit configured to measure insulation resistance of a motor selected as a measurement target to thereby measure the insulation resistance of each of the multiple motors; a measurement interrupting unit configured to interrupt measurement of insulation resistance if a measurement interrupt condition is established; a storage unit configured to store information indicating the motor selected as the measurement target at the time of interruption of the measurement of insulation resistance; and a measurement resuming unit configured to, when measurement is resumed, resume measurement of the insulation resistance sequentially from the motor that had been selected as the measurement target when the measurement was interrupted, based on the information stored in the storage unit.

10 Claims, 7 Drawing Sheets

(58) Field of Classification Search
CPC ......... G01R 27/025; G01R 27/18; H02P 5/00; H02P 5/74
See application file for complete search history.

(56) References Cited

U.S. PATENT DOCUMENTS

| | | | |
|---|---|---|---|
| 2009/0195205 A1* | 8/2009 | Ide | G01R 31/1227 318/490 |
| 2015/0256116 A1 | 9/2015 | Tateda et al. | |
| 2016/0377670 A1 | 12/2016 | Tamida et al. | |

FOREIGN PATENT DOCUMENTS

| | | |
|---|---|---|
| JP | 2009-168643 A | 7/2009 |
| JP | 2009204600 A | 9/2009 |
| JP | 2014-044105 A | 3/2014 |
| JP | 2015-169479 A | 9/2015 |
| WO | WO-2015-076075 A1 | 5/2015 |

* cited by examiner

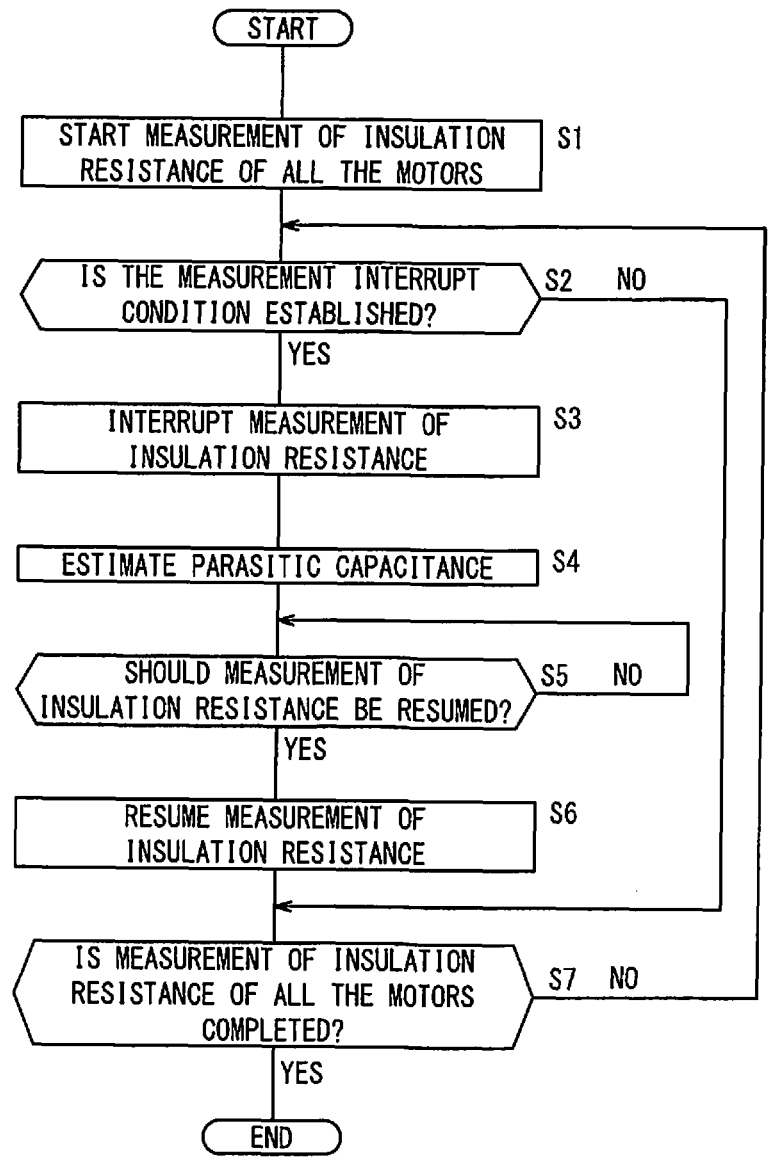

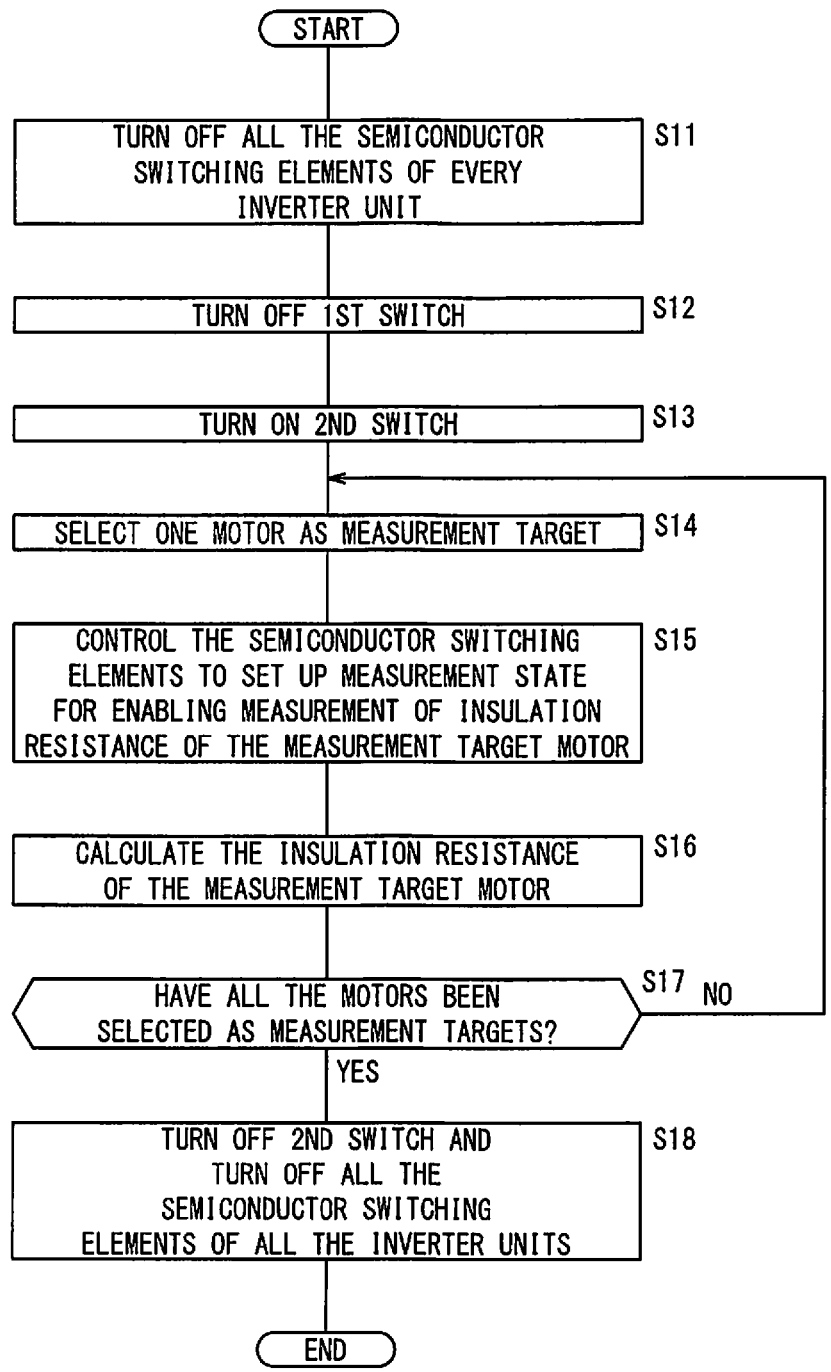

MOTOR DRIVING DEVICE AND MEASURING METHOD

CROSS-REFERENCE TO RELATED APPLICATION

This application is based upon and claims the benefit of priority from Japanese Patent Application No. 2017-235013 filed on Dec. 7, 2017, the contents of which are incorporated herein by reference.

BACKGROUND OF THE INVENTION

Field of the Invention

The present invention relates to a motor driving device and a measuring method for driving a plurality of motors and measuring insulation resistance of a plurality of motors.

Description of the Related Art

Japanese Laid-Open Patent Publication No. 2015-169479 discloses a motor driving device capable of measuring the insulation resistance of motors without being affected by leakage current flowing through semiconductor switching elements of inverter units.

SUMMARY OF THE INVENTION

In Japanese Laid-Open Patent Publication No. 2015-169479, since the insulation resistance of the motors is measured by sequentially selecting the multiple motors one by one, the measurement time tends to be longer correspondingly as the number of motors increases. If the measurement is interrupted for some reason while measuring the insulation resistance of the multiple motors in turn, the insulation resistance of the multiple motors must be measured again from the beginning, which makes the measurement time longer than needed.

It is therefore an object of the present invention to provide a motor driving device and a measuring method for preventing the time required for measuring the insulation resistance of multiple motors from becoming longer than needed.

According to a first aspect of the invention, a motor driving device for driving multiple motors includes: a converter unit configured to convert an AC voltage supplied from an AC power supply via a first switch into a DC voltage; a plurality of inverter units configured to convert the DC voltage converted by the converter unit into an AC voltage to thereby drive the multiple motors; an insulation resistance measuring unit configured to sequentially select one of the multiple motors as a measurement target motor and measure the insulation resistance of the selected measurement target motor to thereby measure insulation resistance of each of the multiple motors; a measurement interrupting unit configured to determine whether or not a measurement interrupt condition is established and interrupt the measurement of the insulation resistance by the insulation resistance measuring unit if the measurement interrupt condition is determined to be established; a storage unit configured to, when the measurement of insulation resistance is interrupted, store information indicating the motor selected as the measurement target motor; and a measurement resuming unit configured to, when the measurement of the insulation resistance is resumed, cause the insulation resistance measuring unit to resume the measurement of the insulation resistance sequentially from the motor that had been selected as the measurement target motor when the measurement was interrupted, based on the information stored in the storage unit.

According to a second aspect of the invention, a measuring method by which a motor driving device for driving multiple motors measures the insulation resistance of the motors. The motor driving device includes: a converter unit configured to convert an AC voltage supplied from an AC power supply via a first switch into a DC voltage; and a plurality of inverter units configured to convert the DC voltage converted by the converter unit into an AC voltage to thereby drive the multiple motors. The measuring method includes: an insulation resistance measuring step of sequentially selecting one of the multiple motors as a measurement target motor and measuring the insulation resistance of the selected measurement target motor to thereby measure the insulation resistance of each of the multiple motors; a measurement interrupting step of determining whether or not a measurement interrupt condition is established and interrupting the measurement of the insulation resistance if the measurement interrupt condition is determined to be established; a storing step of, when the measurement of insulation resistance is interrupted, storing information indicating the motor selected as the measurement target motor, on a storage unit; and a measurement resuming step of, when measurement of the insulation resistance is resumed, resuming the measurement of the insulation resistance sequentially from the motor that had been selected as the measurement target motor when the measurement was interrupted, based on the information stored in the storage unit.

According to the present invention, it is possible to prevent the time required for measuring the insulation resistances of the multiple motors from becoming longer than necessary.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 6 is a flowchart showing the operation of the motor driving device shown in FIG. 1; and FIG. 7 is a flowchart showing a measuring operation of insulation resistance by an insulation resistance measuring unit shown in FIG. 2.

DESCRIPTION OF THE PREFERRED EMBODIMENTS

A motor driving device and a measuring method according to the present invention will be detailed below by describing preferred embodiments with reference to the accompanying drawings.

Embodiment

<Overall Configuration of Motor Driving Device 10>

Figure 1:
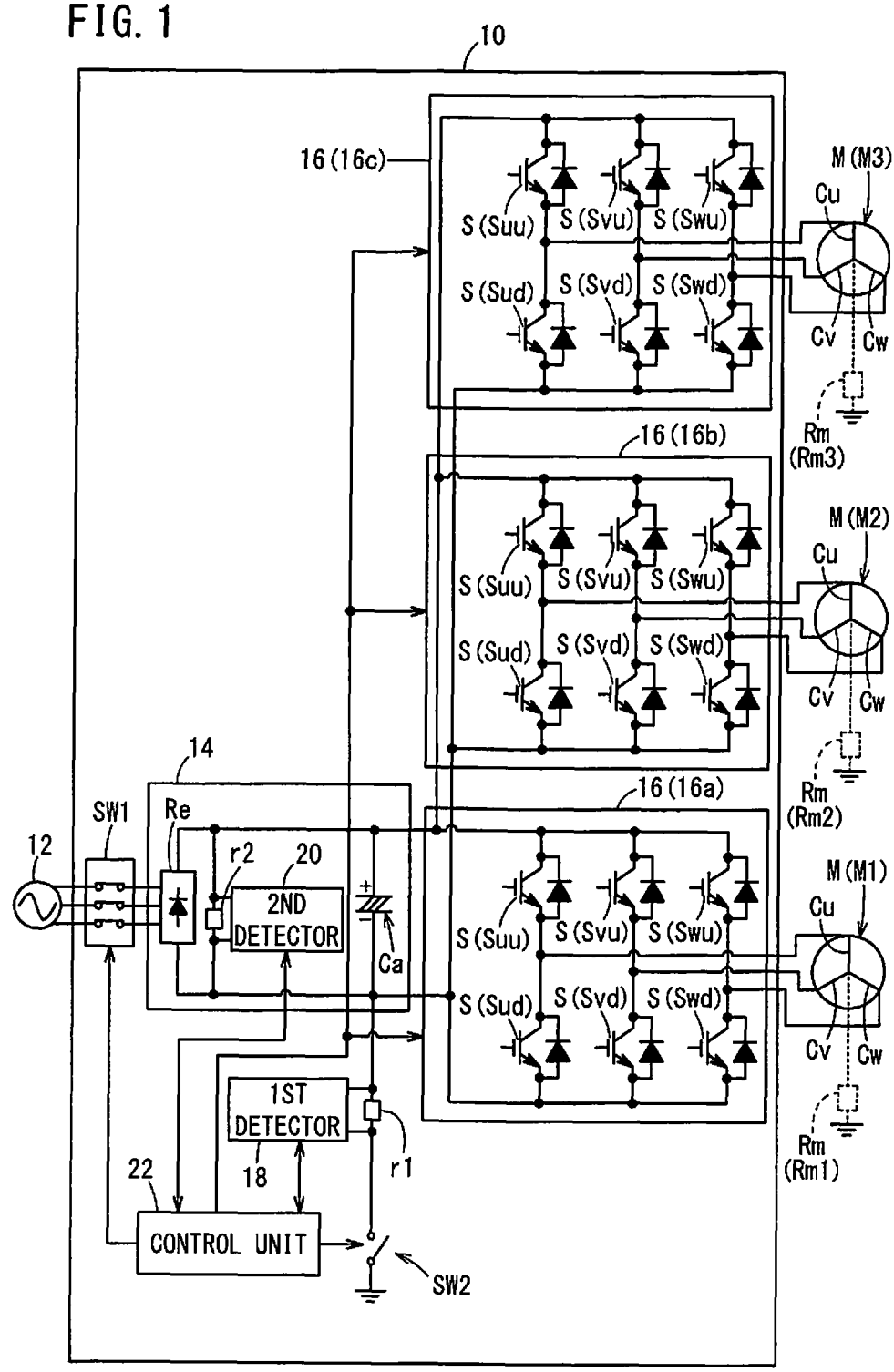
FIG. 1 is a diagram showing a configuration of a motor driving device according to an embodiment.

FIG. 1 is a diagram showing a configuration of a motor driving device 10 according to the embodiment. The motor driving device 10 drives a plurality of motors M. The motor driving device 10 includes a first switch SW1, a converter unit 14, a plurality of inverter units 16, a second switch SW2, a first detector 18, a second detector 20 and a control unit 22.

The first switch SW1 is a switch for turning on/off the supply of AC (alternating-current) voltage from an AC power supply 12.

The converter unit 14 converts the AC voltage supplied from the AC power supply 12 via the first switch SW1 into a DC (direct-current) voltage. The converter unit 14 includes a rectifier circuit Re for rectifying the AC voltage supplied from the AC power supply 12 through the first switch SW1 into a DC voltage and a capacitor Ca for smoothing the DC voltage rectified by the rectifier circuit Re.

The multiple inverter units 16 convert the DC voltage (specifically, the voltage across the capacitor Ca) Vc converted by the converter unit 14 into AC voltage to thereby drive the multiple motors M.

In the present embodiment, in order to simplify the description, it is assumed that three motors M are provided, and the motor driving device 10 includes three inverter units 16 for driving the three motors M. In order to distinguish the three inverter units 16 from each other, the three inverter units 16 may be referred to as 16a, 16b, 16c, respectively. Further, there are cases where the motor M driven by the inverter unit 16a is denoted by M1, the motor M driven by the inverter unit 16b is denoted by M2, and the motor M driven by the inverter unit 16c is denoted by M3.

The resistance between the motor coils Cu, Cv, Cw of three phases (U, V, W) in each of the three motors M (M1 to M3) and the ground is called an insulation resistance (parasitic resistance) Rm. In order to distinguish these three insulation resistances Rm from each other, the insulation resistance Rm between the motor coils Cu, Cv, Cw of the motor M1 and the ground may be referred to as Rm1, the insulation resistance Rm between the motor coils Cu, Cv, Cw of the motor M2 and the ground may be referred to as Rm2, and the insulation resistance Rm between the motor coils Cu, Cv, Cw of the motor M3 and the ground may be referred to as Rm3.

Since the three inverter units 16 (16a, 16b, 16c) have the same configuration, only the configuration of the inverter unit 16a will be described. The inverter unit 16a has a plurality of semiconductor switching elements S. In the present embodiment, since the motor M used has three-phase (U, V, W) motor coils Cu, Cv, Cw, the multiple semiconductor switching elements S include an upper arm semiconductor switching element Suu and a lower arm semiconductor switching element Sud for the U-phase, an upper arm semiconductor switching element Svu and a lower arm semiconductor switching element Svd for the V-phase, and an upper arm semiconductor switching element Swu and a lower arm semiconductor switching element Swd for the W-phase.

The three-phase upper arm semiconductor switching elements Suu, Svu, Swu connect the positive terminal of the capacitor Ca with three-phase (U, V, W) motor coils Cu, Cv, Cw of the motor M1, respectively. The three-phase lower arm semiconductor switching elements Sud, Svd, Swd connect the negative terminal of the capacitor Ca with the three-phase motor coils Cu, Cv, Cw of the motor M1, respectively.

For each phase, the upper arm semiconductor switching element S and the lower arm semiconductor switching element S are connected in series, and the series of the upper arm semiconductor switching element S and the lower arm semiconductor switching element S is connected in parallel with the capacitor Ca. Specifically, the series of U-phase semiconductor switching elements Suu and Sud is connected in parallel with the capacitor Ca. Similarly, the series of V-phase semiconductor switching elements Svu and Svd is connected in parallel with the capacitor Ca, and the series of W-phase semiconductor switching elements Swu and Swd is connected in parallel with the capacitor Ca.

The U-phase motor coil Cu of the motor M1 is connected to the emitter of the upper arm semiconductor switching element Suu and the collector of the lower arm semiconductor switching element Sud. The V-phase motor coil Cv of the motor M1 is connected to the emitter of the upper arm semiconductor switching element Svu and the collector of the lower arm semiconductor switching element Svd. The W-phase motor coil Cw of the motor M1 is connected to the emitter of the upper arm semiconductor switching element Swu and the collector of the lower arm semiconductor switching element Swd.

The inverter unit 16a performs switching operation (ON/OFF operation) on the three-phase upper arm semiconductor switching elements Suu, Svu, Swu and the three-phase lower arm semiconductor switching elements Sud, Svd, Swd to convert the voltage across the capacitor Ca (which will be referred to as the capacitor voltage Vc) into AC voltage to thereby drive the motor M1.

The second switch SW2 is a switch for connecting one terminal of the capacitor Ca (which is the terminal on the negative electrode side of the capacitor Ca in the present embodiment and will be referred as the first terminal) to the ground, in order to measure the insulation resistance Rm (Rm1, Rm2, Rm3).

The first detector 18 is a sensor for detecting the voltage (hereinafter referred to as the ground-referenced voltage Vm) between the first terminal of the capacitor Ca and the ground when the second switch SW2 is ON. A detection resistor r1 is connected in series with the second switch SW2 between the first terminal (the terminal on the negative electrode side) of the capacitor Ca and the ground. The first detector 18 detects the ground-referenced voltage Vm by measuring the voltage Vm across the detection resistor r1. Since the resistance value of the detection resistor r1 is known, the first detector 18 may detect the current flowing between the first terminal of the capacitor Ca and the ground (hereinafter referred to as the ground-referenced current Im), from the detected ground-referenced voltage Vm.

The second detector 20 is a sensor for detecting the capacitor voltage Vc between both terminals of the capacitor Ca. A detection resistor r2 is connected in parallel with the capacitor Ca. The second detector 20 detects the capacitor voltage Vc by measuring the voltage across the detection resistor r2.

The control unit 22 controls diverse components (the first switch SW1, the second switch SW2, the multiple semiconductor switching elements S, etc.) of the motor driving device 10 to drive the motors M (M1 to M3) and the like, and measures the insulation resistances Rm (Rm1 to Rm3) of the multiple motors M (M1 to M3). The control unit 22 is made up of a processor such as a CPU, memory and others.

Figure 2:
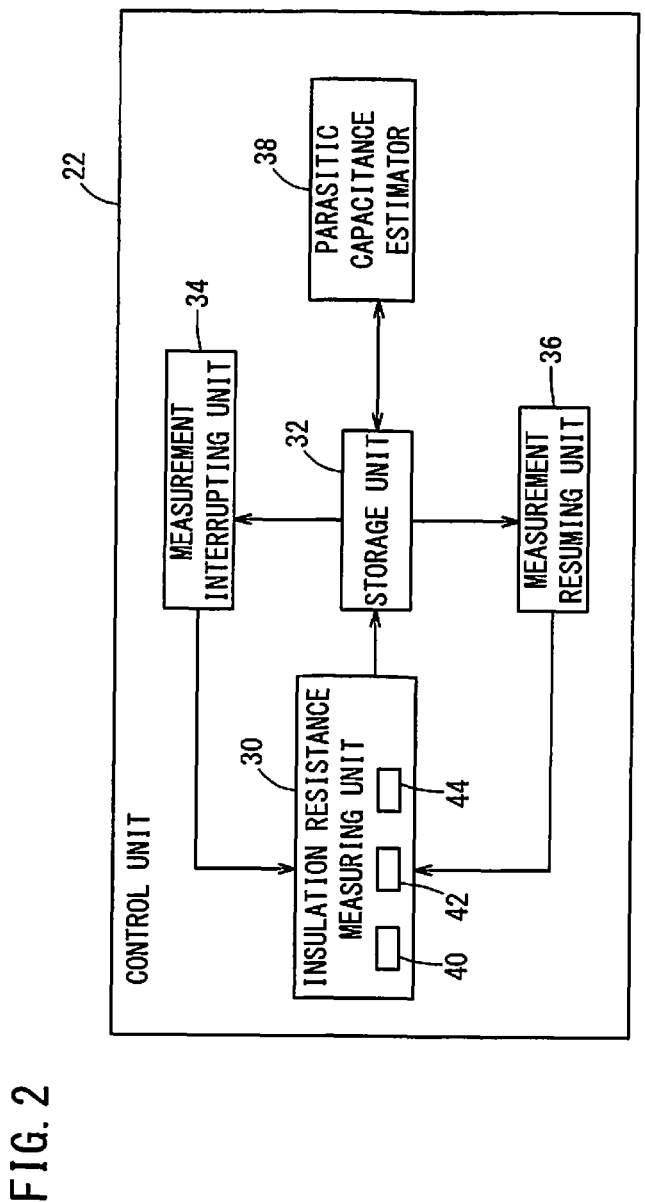
FIG. 2 is a functional block diagram showing the configuration of a control unit shown in FIG. 1.

FIG. 2 is a functional block diagram showing the configuration of the control unit 22. The control unit 22 includes an insulation resistance measuring unit 30, a storage unit 32, a measurement interrupting unit 34, a measurement resuming unit 36, and a parasitic capacitance estimator 38.

The insulation resistance measuring unit 30 sequentially selects the three motors M (M1 to M3) one by one as the motor M to be measured (a measurement target motor M), and measures the insulation resistance Rm of the motor M selected as the measurement target to thereby perform measurement of the insulation resistances Rm (Rm1 to Rm3) of the three motors M (M1 to M3). That is, the insulation resistance measuring unit 30 selects one of the three motors M (M1 to M3) as a measurement target and measures the insulation resistance Rm of the selected motor M, i.e., the measurement target. The insulation resistance measuring unit 30 can measure the insulation resistances Rm (Rm1 to Rm3) of all the motors M (M1 to M3) by switching to a motor M selected as the measurement target from among the motors M. In the present embodiment, the insulation resistance measuring unit 30 selects the motors in turn in the order of M1→M2→M3 as the measurement target motor M, and measures the insulation resistance Rm, in the order of Rm1→Rm2→Rm3.

The insulation resistance measuring unit 30 has a clock circuit (not shown) for measuring time, measures a measurement time Tm for the insulation resistances Rm (i.e., time from the start of measurement of the insulation resistances Rm of the multiple motors M until the interruption or completion of the measurement), and stores the measurement time Tm in the storage unit 32. The insulation resistance measuring unit 30 further stores in the storage unit 32 information indicating the motor M whose insulation resistance Rm is currently being measured (information indicating the motor M currently selected as the measurement target), information indicating the number of the motors M whose insulation resistance Rm has been measured, and the measured values of insulation resistance Rm, the capacitor voltage Vc and the ground-referenced voltage Vm or the ground-referenced current Im, etc. The measurement of the insulation resistance Rm of the measurement target motor M by the insulation resistance measuring unit 30 will be detailed later.

When an interruption signal is sent from the measurement interrupting unit 34, the insulation resistance measuring unit 30 interrupts the measurement of insulation resistance Rm. Further, when a resumption signal is sent from the measurement resuming unit 36, the insulation resistance measuring unit 30 resumes measurement of insulation resistance Rm. At this time, the insulation resistance measuring unit 30 resumes measurement of insulation resistance Rm in turn from the motor M that had been selected as the measurement target when measurement was interrupted.

The storage unit 32 is a storage medium capable of storing information, and is composed of, for example, a nonvolatile memory, a volatile memory or the like.

The measurement interrupting unit 34 determines whether or not a measurement interrupt condition is established. When it is determined that the measurement interrupt condition is established, the measurement interrupting unit 34 interrupts measurement of insulation resistance Rm by the insulation resistance measuring unit 30. The measurement interrupting unit 34 interrupts measurement of insulation resistance Rm by outputting an interruption signal to the insulation resistance measuring unit 30.

Based on the information stored in the storage unit 32, the measurement interrupting unit 34 determines whether or not the measurement interrupt condition is established. For example, when the measurement time Tm of the insulation resistance measuring unit 30 exceeds a predetermined time limit Tp, the measurement interrupting unit 34 may determine that the measurement interrupt condition is established. The predetermined time limit Tp is a predetermined value and may be arbitrarily changed by an operator. Further, when the capacitor voltage Vc becomes equal to or lower than a predetermined voltage limit value Vp, the measurement interrupting unit 34 may determine that the measurement interrupt condition is established. This is because the insulation resistance Rm cannot be correctly measured when the capacitor voltage Vc becomes equal to or lower than the predetermined voltage limit value Vp.

In the case of resuming the measurement of insulation resistance Rm, the measurement resuming unit 36, based on the information stored in the storage unit 32, resumes measuring the insulation resistance Rm by the insulation resistance measuring unit 30, sequentially from the motor M that had been selected as a measurement target when interrupted. The measurement resuming unit 36 outputs a resumption signal including information indicating the motor M that had been selected as a measurement target when interrupted, to the insulation resistance measuring unit 30, to thereby resume measurement of insulation resistance Rm. For example, when the motor M2 has been selected as the measurement target and the measurement of the insulation resistance Rm2 of the motor M2 is interrupted by the measurement interrupting unit 34, the measurement resuming unit 36 resumes measurement sequentially from the insulation resistance Rm2 of the motor M2. Thus, after resumption of the measurement, the insulation resistances Rm2 and Rm3 are measured in this order.

The measurement resuming unit 36 may resume measuring insulation resistance Rm when a resumption command is given by the operator or may resume the measurement of insulation resistance Rm after a predetermined time has passed since the measurement was interrupted under the condition that an insulation resistance measuring command had been given. When the measurement was interrupted due to a situation of lowering the capacitor voltage Vc down to the predetermined voltage limit value Vp or less, the measurement of insulation resistance Rm may be resumed if the capacitor voltage Vc is charged to a predetermined voltage level under the condition that an insulation resistance measuring command has been issued.

The parasitic capacitance estimator 38 estimates parasitic capacitance Cs of all the motors M (M1 to M3) connected to the motor driving device 10, based on the number of the motors M whose insulation resistance Rm had been measured by the measurement interrupting unit 34 before interruption of the measurement of insulation resistance Rm, the measured values of insulation resistances Rm, and the measurement time Tm (the time from the start of measurement until the interruption). For example, in a case that the measurement is interrupted by the measurement interrupting unit 34 when the motor M2 has been selected as a measurement target and the insulation resistance Rm2 of the motor M2 is being measured, the parasitic capacitance estimator 38 estimates the parasitic capacitance Cs of all the motors M (M1 to M3), based the number of motors M (=1), the measured insulation resistance Rm1 and the measurement time Tm from the start of the measurement to the interruption.

Alternatively, the parasitic capacitance Cs may be estimated from the values of insulation resistances Rm (Rm1 to Rm3) of all the motors M (M1 to M3) being connected in parallel and the measurement time Tm. The estimated parasitic capacitance Cs is stored in the storage unit 32.

<Insulation Resistance Measuring Unit 30>

Next, the insulation resistance measuring unit 30 will be described in detail. The insulation resistance measuring unit 30 includes a measurement target selector 40, a switch control unit 42, and an insulation resistance calculator 44.

The measurement target selector 40 selects one motor M as a measurement target. The measurement target motor M may be selected at random or based on a predetermined order. The measurement target selector 40 outputs information indicating the motor M selected as the measurement target, to the switch control unit 42. In the present embodiment, the insulation resistance measuring unit 30 selects measurement target motors M in the order of M1→M2→M3.

The switch control unit 42 performs on/off control of each of the first switch SW1, the second switch SW2 and the multiple semiconductor switching elements S. In measuring the insulation resistance Rm, the switch control unit 42 controls each of the first switch SW1, the second switch SW2 and the multiple semiconductor switching elements S so as to set up a measurement state for enabling measurement of the insulation resistance Rm of the motor M selected as the measurement target.

First, the switch control unit 42 turns off all the multiple semiconductor switching elements S (Suu, Svu, Swu, Sud, Svd, Swd) of each of all the (three) inverter units 16 (16a to 16c), to thereby stop the operation of all the motors M (M1 to M3).

Then, the switch control unit 42 turns off the first switch SW1 and turns on the second switch SW2. Thus, the AC voltage from the AC power supply 12 is not supplied to the motor driving device 10 while the first terminal of the capacitor Ca (in this embodiment, the terminal on the negative electrode side of the capacitor Ca) is connected to the ground. As a result, the motor driving device 10 enters a measurement preparation state.

Figure 3:
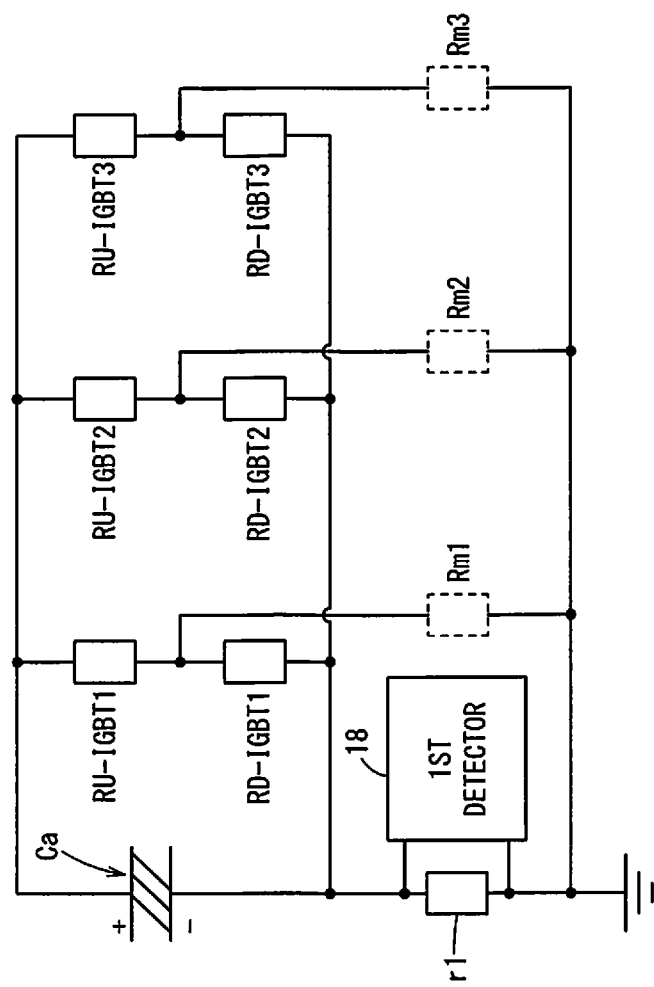
FIG. 3 is an equivalent circuit diagram showing the connection of the insulation resistance of motors using an equivalent circuit when the motor driving device is in a measurement preparation state.

FIG. 3 is an equivalent circuit diagram of a state where the motor driving device 10 is set in the measurement preparation state (that is, all the multiple semiconductor switching elements S of every inverter unit 16 are turned off while the first switch SW1 is turned off and the second switch SW2 is turned on), showing the connection of the insulation resistances Rm (Rm1 to Rm3) of the motors M (M1 to M3) as an equivalent circuit.

Here, an RU-IGBT1 in FIG. 3 represents the equivalent insulation resistance of the three upper arm semiconductor switching elements Suu, Svu, Swu of the inverter unit 16a when they are in the off state. The RU-IGBT2 represents the equivalent insulation resistance of the three upper arm semiconductor switching elements Suu, Svu, and Swu of the inverter unit 16b when they are in the off state. The RU-IGBT3 represents the equivalent insulation resistance of the three upper arm semiconductor switching elements Suu, Svu, and Swu of the inverter unit 16c when they are in the off state. The equivalent insulation resistances RU-IGBT1, RU-IGBT2 and RU-IGBT3 are each the quotient obtained by dividing the voltage applied between the collector and the emitter of the three upper arm semiconductor switching elements Suu, Svu, Swu of the associated inverter unit 16a, 16b, 16c by the leakage current flowing from the collector to the emitter when they are in the off state.

On the other hand, the RD-IGBT1 shown in FIG. 3 represents the equivalent insulation resistance of the three lower arm semiconductor switching elements Sud, Svd, Swd of the inverter unit 16a when they are in the off state. The RD-IGBT2 represents the equivalent insulation resistance of the three lower arm semiconductor switching elements Sud, Svd, Swd of the inverter unit 16b when they are in the off state. The RD-IGBT3 represents the equivalent insulation resistance of the three lower arm semiconductor switching elements Sud, Svd, Swd of the inverter unit 16c when they are in the off state. The equivalent insulation resistances RD-IGBT1, RD-IGBT2 and RD-IGBT3 are each the quotient obtained by dividing the voltage applied between the collector and the emitter of the three lower arm semiconductor switching elements Sud, Svd, Swd of the associated inverter unit 16a, 16b, 16c by the leakage current flowing from the collector to the emitter when they are in the off state.

When putting the motor driving device 10 into the measurement preparation state, the switch control unit 42, based on the information indicating a motor M selected as a measurement target by the measurement target selector 40, controls at least the semiconductor switching elements S of the inverter unit 16 that drives the motor M selected as the measurement target. This control will be described later in detail, but in short, the switch control unit 42 controls at least the semiconductor switching elements S of the inverter unit 16 that drives the measurement target motor M, so as to apply the capacitor voltage Vc across (so as to flow a current from capacitor Ca through) only the insulation resistance Rm of the measurement target motor M, of the insulation resistances Rm of the three motors M.

Thereby, the motor driving device 10 is placed in the measurement state that enables the insulation resistance Rm of the measurement target motor M. At this time, the ground-referenced voltage Vm is detected by the first detector 18. It should be noted that the first detector 18 may detect the ground-referenced current Im. This ground-referenced current Im is a current that flows through the insulation resistance Rm of the measurement target motor M when in the measurement state.

The insulation resistance calculator 44 calculates the insulation resistance Rm, based on the ground-referenced voltage Vm or the ground-referenced current Im detected by the first detector 18, the capacitor voltage Vc detected by the second detector 20 and the detection resistor r1.

<Specific Control of Switch Control Unit 42>

Next, the control of the switch control unit 42 will be described in detail.

When putting the motor driving device 10 into the measurement preparation state, the switch control unit 42 controls the inverter unit 16 connected to the measurement target motor M selected by the measurement target selector 40, so that, among the multiple semiconductor switching elements S, at least one of the semiconductor switching elements S connected to the second terminal (the other terminal) of the capacitor Ca (i.e., the terminal opposite to the first terminal of the capacitor Ca and connected to the ground through the second switch SW2) is turned on. Thereby, the motor coils Cu, Cv, Cw of the measurement target motor M have the same potential as the second terminal of the capacitor Ca.

In the present embodiment, since the terminal on the negative side of the capacitor Ca is adopted as the first terminal (one terminal), the switch control unit 42 may turn on at least one of the multiple upper arm semiconductor switching elements Suu, Svu, Swu of the inverter unit 16 connected to the measurement target motor M. As a result, the motor coils Cu, Cv, Cw of the measurement target motor M have the same potential as the positive terminal of the capacitor Ca. In this case, the semiconductor switching element S to be put into the ON state may be any of the U-phase, the V-phase and the W-phase semiconductor switching elements S, that is, any of the multiple upper arm semiconductor switching elements Suu, Svu, Swu.

Figure 4:
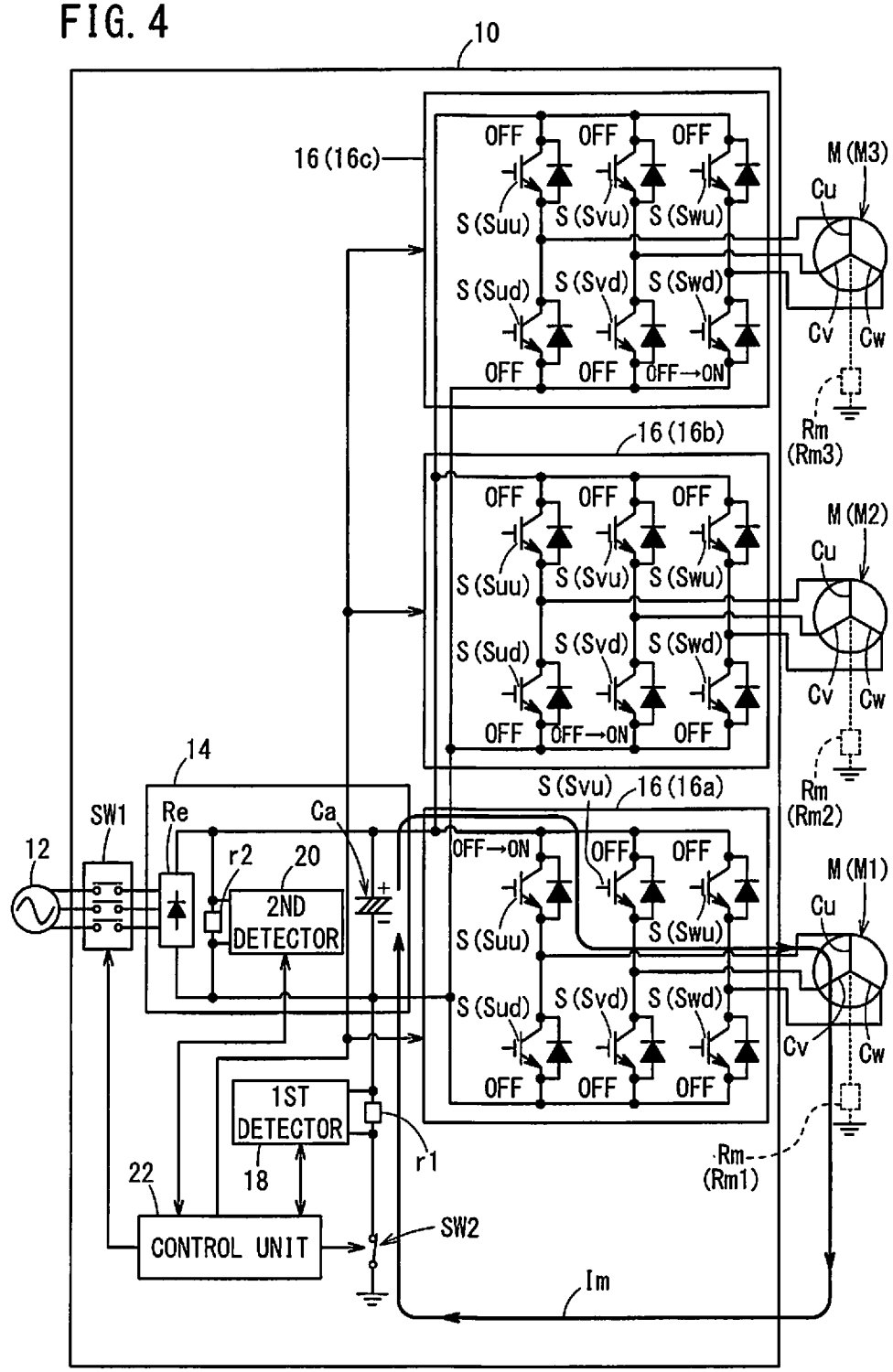
FIG. 4 is a diagram showing the flow of current when the motor driving device shown in FIG. 1 is in a measurement state.

In the example shown in FIG. 4, when the measurement target motor M is the motor M1, the U-phase upper arm semiconductor switching element Suu of the inverter unit 16a is placed in the ON state. With this settings, for the inverter unit 16a connected to the measurement target motor M1, the capacitor Ca, the upper arm semiconductor switching element S in its ON state (the semiconductor switching element Suu in the example shown in FIG. 4), the insulation resistance Rm1 between the motor coils Cu, Cv, Cw of the measurement target motor M and the ground, and the detection resistor r1 jointly form a closed circuit.

Further, as to the inverter units 16 connected to the motors M other than the measurement target motor M selected by the measurement target selector 40, the switch control unit 42 turns on at least one of the multiple semiconductor switching elements S that are connected to the first terminal of the capacitors Ca (the capacitor Ca's terminal connected to the ground through the second switch SW2). As a result, all the motor coils Cu, Cv, Cw of the motors M other than the measurement target have the same potential as the first terminal of the capacitor Ca.

In the present embodiment, since the terminal on the negative side of the capacitor Ca is adopted as the first terminal, the switch control unit 42 only has to turn on at least one of the multiple lower arm semiconductor switching elements Sud, Svd, Swd of the inverter units 16 connected to the motors M other than the measurement target. As a result, the motor coils Cu, Cv, Cw of the motors M other than the measurement target have the same potential as the negative terminal of the capacitor Ca. At this time, the semiconductor switching element S to be put into the ON state may be any of the U-phase, the V-phase and the W-phase semiconductor switching elements S, that is, any of the multiple lower semiconductor switching elements Sud, Svd, Swd.

In the example shown in FIG. 4, the V-phase lower arm semiconductor switching element Svd of the inverter unit 16b is turned ON while the W-phase lower arm semiconductor switching element Swd of the inverter unit 16c is turned ON. This setting makes it possible to eliminate unnecessary current flowing through the detection resistor r1 via the motors M2 and M3 other than the measurement target.

Figure 5:
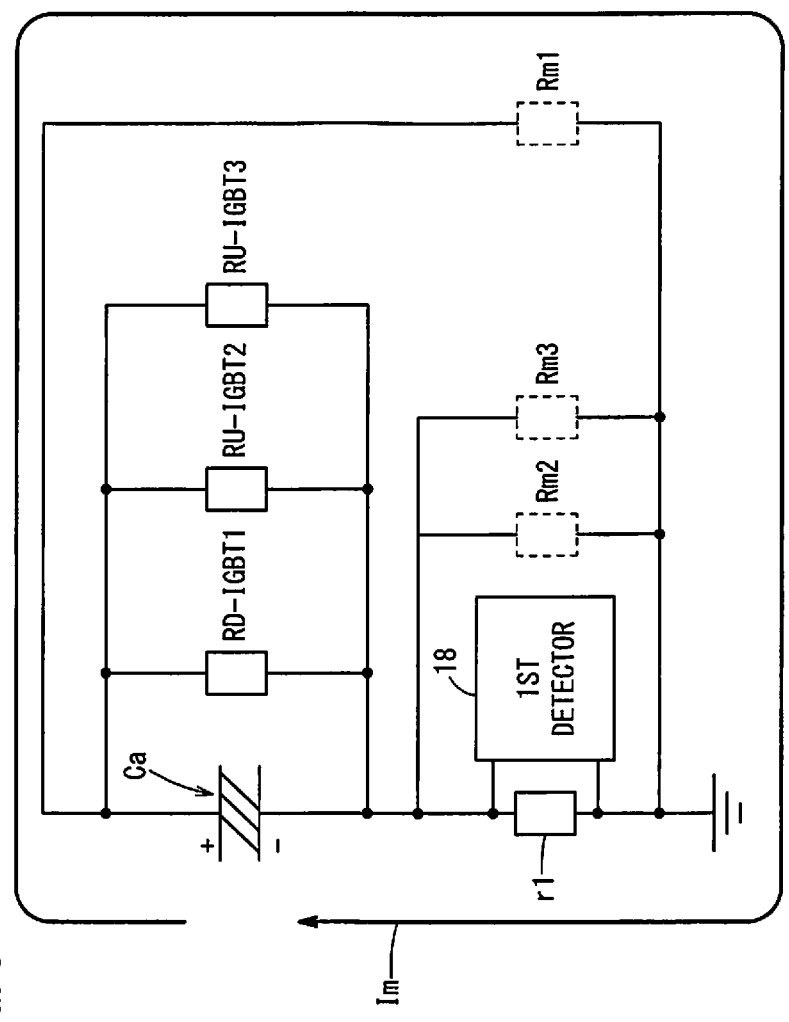
FIG. 5 is an equivalent circuit diagram showing the connection of the insulation resistance of the motor under a measurement state of the motor driving device shown in FIG. 1 using an equivalent circuit.

FIG. 5 is an equivalent circuit diagram showing an equivalent circuit where, in the equivalent circuit shown in FIG. 3, the upper arm semiconductor switching element S of the inverter unit 16a for driving the measurement target motor M1 is turned on while the lower arm semiconductor switching elements S of the inverter units 16b, 16c for driving the motors M2, M3 other than the measurement target are turned on.

The equivalent circuit diagram of FIG. 5 is obtained by short-circuiting the equivalent insulation resistance RU-IGBT1 of the upper arm of the inverter unit 16a, the equivalent insulation resistance RD-IGBT2 of the lower arm of the inverter unit 16b, and the equivalent insulation resistance RD-IGBT3 of the lower arm of the inverter unit 16c in the equivalent circuit diagram of FIG. 3. As is apparent from FIG. 5, the equivalent insulation resistance RD-IGBT1 of the lower arm of the inverter unit 16a, the equivalent insulation resistance RU-IGBT2 of the upper arm of the inverter unit 16b, and the equivalent insulation resistance RU-IGBT3 of the upper arm of the inverter unit 16c are all connected to both the positive terminal and the negative terminal of the capacitor Ca. Accordingly, leakage current flowing through these equivalent insulation resistors RD-IGBT1, RU-IGBT2 and RU-IGBT3 only flows from the terminal on the positive electrode side of the capacitor Ca to the terminal on the negative electrode side thereof, so that the leakage current does not flow through the detection resistor r1. Thus, it is understood that the measurement of the insulation resistance Rm1 of the measurement target motor M1 will not be affected at all. In other words, it is possible to consider that these equivalent insulation resistances RD-IGBT1, RU-IGBT2 and RU-IGBT3 do not exist when the insulation resistance Rm1 is measured.

At this time, the insulation resistances Rm2 and Rm3 of the motors M2 and M3 other than the measurement target are connected in parallel with the first detector 18. However, if the resistance of the detection resistor r1 is sufficiently smaller than the insulation resistances Rm2 and Rm3, the influence on the voltage detection and the current detection can be ignored. Therefore, it is possible to consider that the insulation resistances Rm2, Rm3 of the motors M2, M3 other than the measurement target do not exist when the insulation resistance Rm1 is measured. It is noted that measurement may be carried out by turning off all the lower arm semiconductor switching elements S so as to obtain the resistance value when the insulation resistances Rm (Rm1 to Rm3) of all the motors M (M1 to M3) are connected in parallel, and then the influence of Rm2 and Rm3 may be compensated by using the obtained resistance value.

Thus, it is possible to improve the accuracy with which the insulation resistance calculator 44 calculates the insulation resistance Rm of the measurement target motor M.

<Operation of Motor Driving Device 10>

Next, the operation of the motor driving device 10 will be described with reference to the flowchart shown in FIG. 6. At step S1, the insulation resistance measuring unit 30 starts measurement of insulation resistance Rm of all the motors M (M1 to M3). The insulation resistance measuring unit 30 sequentially selects each of all the motors M (M1 to M3) one by one as the measurement target motor M, and measures the insulation resistance Rm of the selected measurement target motor M, whereby measurement of the insulation resistances Rm of all the motors M (M1 to M3) are performed. The measuring operation of the insulation resistances Rm of all the motors M (M1 to M3) will be described later.

Also, during the measurement of insulation resistance Rm of the multiple motors M (M1 to M3), the insulation resistance measuring unit 30 stores in the storage unit 32 the measurement time Tm for insulation resistance Rm, information indicating the motor M being selected as the measurement target, information indicating the number of motors M whose resistance Rm has been already measured, and the measured values of insulation resistance Rm, capacitor voltage Vc, ground-referenced voltage Vm or ground-referenced current Im, etc.

Next, at step S2 the measurement interrupting unit 34 determines whether or not the measurement interrupt condition is established. The measurement interrupting unit 34 may determine that the measurement interrupt condition is established if the measurement time Tm of the insulation resistance measuring unit 30 exceeds the predetermined time limit Tp. The measurement interrupting unit 34 also may determine that the measurement interrupt condition is established if the capacitor voltage Vc is equal to or lower than the predetermined voltage limit value Vp. The measurement interrupting unit 34 determines whether the measurement interrupt condition is established or not, based on the information stored in the storage unit 32.

At step S2, when it is determined that the measurement interrupt condition is not established, the control goes to step S7. When it is determined that the measurement interrupt condition is established, the control proceeds to step S3. At step S3, the measurement interrupting unit 34 interrupts the measurement of insulation resistance Rm by the insulation resistance measuring unit 30.

Next, at step S4, the parasitic capacitance estimator 38 estimates the parasitic capacitance Cs of all the motors M (M1 to M3) connected to the motor driving device 10, based on the number of the motors M whose insulation resistance Rm was already measured before the measurement interrupting unit 34 interrupts the measurement of insulation resistance Rm, the measured values of insulation resistances Rm, and the measurement time Tm. The parasitic capacitance estimator 38 estimates the parasitic capacitance Cs based on the information stored in the storage unit 32.

Next, at step S5, the measurement resuming unit 36 determines whether or not to resume the measurement of insulation resistance Rm. The measurement resuming unit 36 determines to resume measurement if a resumption command is given by the operator, or if a predetermined time has elapsed since the measurement was interrupted under the condition that the insulation resistance measurement command had been issued. Also, in a case where the measurement was interrupted due to a situation that the capacitor voltage Vc was equal to or lower than the predetermined voltage limit value Vp, the measurement resuming unit 36 may determine to resume measurement if the capacitor voltage Vc is charged to a predetermined voltage level under the condition that the insulation resistance measurement command has been issued.

When it is determined at step S5 that the measurement resuming unit 36 does not resume measurement, the control stays at step S5 until measurement is determined to be resumed. When it is determined to resume measurement, the control goes to step S6. At step S6, the measurement resuming unit 36 resumes the measurement by the insulation resistance measuring unit 30, and the control proceeds to step S7. The measurement resuming unit 36 resumes the measurement of insulation resistance Rm by the insulation resistance measuring unit 30 in sequence from the motor M that had been selected as the measurement target when the measurement was interrupted. The measurement resuming unit 36 identifies the motor M that had been selected as the measurement target when the measurement was interrupted, based on the information stored in the storage unit 32.

At step S7, the insulation resistance measuring unit 30 determines whether or not the measurement of the insulation resistance Rm for all the motors M (M1 to M3) has been completed. If it is determined at step S7 that the measurement of insulation resistance Rm has not been completed, the control returns to step S2 and the above-described operation is performed. In other words, the control from steps S2 to S6 is repeated from the start until the completion of the measurement of the insulation resistance Rm.

<Measuring Operation of Insulation Resistance Rm by Insulation Resistance Measuring Unit 30>

Next, the operation of measuring insulation resistance Rm by the insulation resistance measuring unit 30 will be described with reference to the flowchart shown in FIG. 7. When the measurement of insulation resistance Rm is started at step S1 of FIG. 6, the insulation resistance measuring unit 30 performs the operation shown in FIG. 7. In order to simplify the explanation, FIG. 7 shows an operation where the insulation resistance Rm of all the motors M (M1 to M3) is measured without being interrupted by the measurement interrupting unit 34.

At step S11, the switch control unit 42 turns off all the multiple semiconductor switching elements S (Suu, Svu, Swu, Sud, Svd, Swd) of every inverter unit 16 (16a, 16b, 16c). As a result, operation of all the motors M (M1 to M3) is stopped.

Next, at step S12, the switch control unit 42 turns off the first switch SW1. As a result, the supply of the AC voltage from the AC power supply 12 to the motor driving device 10 is shut off.

Then, at step S13, the switch control unit 42 turns on the second switch SW2. This creates a state in which the negative electrode terminal (the first terminal) of the capacitor Ca is connected to the ground. As a result, the motor driving device 10 enters the measurement preparation state, which is represented by the equivalent circuit in FIG. 3.

At step S14, the measurement target selector 40 selects one of the motors M (M1 to M3) as a measurement target. At this time, the measurement target selector 40 selects a motor M which has not yet been selected as the measurement target. When a measurement target motor M is selected at step S14, information indicating this newly selected motor M is stored as the currently-selected measurement target motor M in the storage unit 32.

Next, at step S15, the switch control unit 42 controls the semiconductor switching elements S of the multiple inverter units 16 (16a, 16b, 16c) so as to set up the measurement state in which the insulation resistance Rm of the measurement target motor M selected at step S14 can be measured.

Specifically, with regard to the inverter unit 16 connected to the measurement target motor M, the switch control unit 42 turns on one of the upper arm semiconductor switching elements S connected to the positive terminal (the second terminal) of the capacitor Ca. Further, with regard to the inverter units 16 connected to the motors M other than the measurement target motor, the switch control unit 42 turns on one of the lower arm semiconductor switching elements S connected to the negative terminal (the first terminal) of the capacitor Ca. As a result, when, for example, the motor M1 is the measurement target motor M, the equivalent circuit shown in FIG. 3 is changed into the state as shown in FIG. 5. Therefore, the current Im from the capacitor Ca flows through the insulation resistance Rm1 of the measurement target motor M1 and the detection resistor r1, and returns to the capacitor Ca.

Next, at step S16, the insulation resistance calculator 44 calculates the insulation resistance Rm of the measurement target motor M, based on the ground-referenced voltage Vm or the ground-referenced current Im detected by the first detector 18 and the capacitor voltage Vc detected by the second detector 20.

Next, at step S17, the measurement target selector 40 determines whether or not all the motors M have been selected as measurement targets. That is, the measurement target selector 40 determines whether there is still any motor M not selected as a measurement target. This determination process is the same as that at step S7 in FIG. 6. If it is determined at step S17 that not all the motors M have been selected as measurement targets, that is, if there is a motor M that has not yet been selected as a measurement target, the control returns to step S14.

If it is determined at step S17 that all the motors M have been selected as measurement targets, the control proceeds to step S18, in which the switch control unit 42 turns off the second switch SW2, and also turns off all the multiple semiconductor switching elements S of every inverter unit 16 (16a to 16c). As a result, the measurement operation is terminated.

If measurement of insulation resistance Rm is interrupted by the measurement interrupting unit 34 before it is determined at step S17 that all the motors M have been selected as measurement targets, the second switch SW2 is turned off and all the semiconductor switching elements S of every inverter unit 16 (16a to 16c) are turned off. At this time, the capacitor Ca may be charged by turning on the first switch SW1. Then, when measurement is resumed by the measurement resuming unit 36, the operation shown in FIG. 7 is resumed. At step S14 first performed after the operation shown in FIG. 7 has been resumed, the motor M selected as the measurement target when interrupted is selected as the measurement target.

In this manner, when the measurement interrupt condition is established and then the measurement of the insulation resistance Rm of the multiple motors M is interrupted, measurement of insulation resistance Rm is resumed in sequence from the motor M that had been selected as the measurement target when the measurement was interrupted, based on the information stored in the storage unit 32. In this way, even if the measurement is resumed after interruption, it is no longer necessary to measure again the insulation resistance Rm of the motors M that has been already measured. Therefore, it is possible to prevent the time required for measuring the insulation resistance Rm of the multiple motors M from becoming longer than necessary.

As the measurement interrupt condition, the predetermined voltage limit value Vp for the capacitor voltage Vc is provided. Thus, the measurement can be interrupted or stopped when the capacitor voltage Vc becomes equal to or less than the predetermined voltage limit value Vp. If the measurement is continued even after the capacitor voltage Vc has become equal to or lower than the predetermined voltage limit value Vp, the insulation resistance Rm cannot be correctly measured, and consequently the measurement time Tm required for measuring the insulation resistances Rm of the multiple motors M becomes longer. However, in the present embodiment, such a problem will not occur.

In addition, as the measurement interrupt condition, the predetermined time limit Tp for the measurement time Tm is provided. Thus, the measurement can be interrupted or stopped when the measurement time Tm becomes longer than the predetermined time limit Tp. Thus, this meets the operator's demand that the measurement be done as long as possible within a given time period if the measurement time Tm becomes long. When measurement is interrupted or stopped due to a long measurement time Tm, if the insulation resistance Rm is correctly measured, the operator can recognize that the measurement time Tm becomes long due to a large parasitic capacitance Cs of the motor M, not because of device malfunction.

Also, based on the number of motors M whose insulation resistance Rm was already measured before interruption of the measurement, the measured values of insulation resistance Rm, and the measurement time Tm until interruption of the measurement, it is possible to estimate the parasitic capacitance Cs of every motor M (M1 to M3) connected to the motor driving device 10. [Modified Example]

In the above embodiment, the negative terminal of the capacitor Ca is taken as the first terminal, but the positive terminal of the capacitor Ca may be adopted as the first terminal. In this case, the positive terminal of the capacitor Ca is connected to the ground via the second switch SW2 while the detection resistor r1 is connected in series with the second switch SW2 between the positive terminal (the first terminal) of the capacitor Ca and the ground. Also in this case, the insulation resistance Rm of the motor M can be measured.

[Technical Idea Obtained from Embodiment]

Technical ideas that can be grasped from the above embodiment and modifications are described below.

<First Technical Idea>

The motor driving device (10) for driving multiple motors (M) includes: a converter unit (14) configured to convert an AC voltage supplied from an AC power supply (12) via a first switch (SW1) into a DC voltage; a plurality of inverter units (16) configured to convert the DC voltage converted by the converter unit (14) into an AC voltage to thereby drive the multiple motors (M); an insulation resistance measuring unit (30) configured to sequentially select one of the multiple motors (M) as a measurement target motor (M) and measure the insulation resistance (Rm) of the selected measurement target motor (M) to thereby measure the insulation resistance (Rm) of each of the multiple motors (M); a measurement interrupting unit (34) configured to determine whether or not the measurement interrupt condition is established, and interrupt the measurement of the insulation resistance (Rm) by the insulation resistance measuring unit (30) if the measurement interrupt condition is determined to be established; a storage unit (32) configured to, when the measurement of the insulation resistance (Rm) is interrupted, store information indicating the motor (M) selected as the measurement target motor; and a measurement resuming unit (36) configured to, when the measurement of the insulation resistance (Rm) is resumed, cause the insulation resistance measuring unit (30) to resume the measurement of the insulation resistance (Rm) sequentially from the motor (M) that had been selected as the measurement target motor when the measurement was interrupted, based on the information stored in the storage unit (32).

This configuration eliminates the need to measure the insulation resistance (Rm) of the motor (M) that has already been measured even when measurement is resumed after interruption. Therefore, it is possible to prevent the time required for measuring the insulation resistance (Rm) of the multiple motors (M) from becoming longer than necessary.

The converter unit (14) may include a rectifier circuit (Re) configured to rectify an AC voltage supplied from the AC power supply (12) through the first switch (SW1) to thereby obtain a DC voltage, and a capacitor (Ca) configured to smooth the DC voltage obtained by the rectifier circuit (Re). The inverter unit (16) may include upper arm semiconductor switching elements (S) configured to connect the positive terminal of the capacitor (Ca) with motor coils (Cu, Cv, Cw) of the motor (M) and lower arm semiconductor switching elements (S) configured to connect the negative terminal of the capacitor (Ca) with the motor coils (Cu, Cv, Cw), and be configured to drive the motor (M) by converting the capacitor voltage (Vc) across the capacitor (Ca) into an AC voltage by switching operation of the upper arm semiconductor switching elements (S) and the lower arm semiconductor switching elements (S). The motor driving device (10) may include a second switch (SW2) configured to connect one terminal (the first terminal) of the positive terminal and the negative terminal of the capacitor (Ca) to the ground, a first detector (18) configured to detect a ground-referenced current (Im) flowing between the one terminal of the capacitor (Ca) and the ground, or a ground-referenced voltage (Vm) between the one terminal of the capacitor (Ca) and the ground, and a second detector (20) configured to detect the capacitor voltage (Vc) across the capacitor (Ca). The insulation resistance measuring unit (30) may include a measurement target selector (40) configured to sequentially select one motor (M) from among the multiple motors (M) as the measurement target motor, a switch control unit (42) configured to set up a measurement state for enabling the measurement of the insulation resistance (Rm) of the measurement target motor (M) by turning off the upper arm semiconductor switching elements (S) and the lower arm semiconductor switching elements (S) of each of the multiple inverter units (16) to thereby stop operation of the multiple motors (M), turning off the first switch (SW1) and turning on the second switch (SW2), and then turning on a semiconductor switching element (S) that is connected to the other terminal (the second terminal) of the capacitor (Ca), among the upper arm and lower arm semiconductor switching elements (S) to which the motor coils (Cu, Cv, Cw) of the measurement target motor (M) are connected, an insulation resistance calculator (44) configured to, in the measurement state, calculate the insulation resistance (Rm) of the measurement target motor (M), based on the ground-referenced current (Im) or the ground-referenced voltage (Vm) detected by the first detector (18), and the capacitor voltage (Vc) detected by the second detector (20). With this configuration, the calculation accuracy (measurement accuracy) of the insulation resistance (Rm) is improved.

The measurement interrupting unit (34) may determine that the measurement interrupt condition is established if the capacitor voltage (Vc) detected by the second detector (20) becomes equal to or lower than a predetermined voltage limit value (Vp). If the measurement is continued even after the capacitor voltage (Vc) has become equal to or lower than the predetermined voltage limit value (Vp), the insulation resistance (Rm) becomes less able to be correctly measured, and the measurement time (Tm) of the insulation resistance (Rm) of the multiple motors (M) becomes longer. In this configuration, this kind of problem will not occur.

The measurement interrupting unit (34) may determine that the measurement interrupt condition is established if the time of measurement by the insulation resistance measuring unit (30) exceeds a predetermined time limit (Tp).

This configuration makes it possible to interrupt measurement when the measurement time (Tm) becomes longer than the predetermined time limit (Tp). Thus, this meets the operator's demand that too long measurement should not be performed if the measurement time (Tm) becomes too long. When measurement is interrupted due to a long measurement time (Tm), if the insulation resistance (Rm) is correctly measured, the operator can recognize that the measurement time (Tm) becomes long due to a large parasitic capacitance (Cs) of the motor (M), not because of device malfunction.

The motor driving device (10) may further include a parasitic capacitance estimator (38) configured to estimate parasitic capacitance (Cs) of all the motors (M) connected to the motor driving device (10), based on the number of the motors (M) whose insulation resistance (Rm) had been already measured before the measurement of the insulation resistance (Rm) was interrupted by the measurement interrupting unit (34), the measured values of insulation resistance (Rm), and the measurement time (Tm) until the measurement of the insulation resistance (Rm) is interrupted by the measurement interrupting unit (34). This configuration enables estimation of the parasitic capacitance (Cs) of all the motors (M) when the measurement is interrupted.

<Second Technical Idea>

The second technical idea provides a measuring method by which a motor driving device (10) for driving a plurality of motors (M) measures the insulation resistance (Rm) of the motors (M). The motor driving device (10) includes: a converter unit (14) configured to convert an AC voltage supplied from an AC power supply (12) via a first switch (SW1) into a DC voltage; and a plurality of inverter units (16) configured to convert the DC voltage converted by the converter unit (14) into an AC voltage to thereby drive the multiple motors (M). The measuring method includes: an insulation resistance measuring step of sequentially selecting one of the multiple motors (M) as a measurement target motor (M) and measuring the insulation resistance (Rm) of the selected measurement target motor (M) to thereby measure the insulation resistance (Rm) of each of the multiple motors (M); a measurement interrupting step of determining whether or not the measurement interrupt condition is established and interrupting the measurement of the insulation resistance (Rm) if the measurement interrupt condition is determined to be established; a storing step of, when the measurement of insulation resistance (Rm) is interrupted, storing information indicating the motor (M) selected as the measurement target motor, on a storage unit (32); and a measurement resuming step of, when measurement of the insulation resistance (Rm) is resumed, resuming measurement of the insulation resistance (Rm) sequentially from the motor (M) that had been selected as the measurement target motor when the measurement was interrupted, based on the information stored in the storage unit (32).

This configuration eliminates the need to measure the insulation resistance (Rm) of the motor (M) that has already been measured even when measurement is resumed after interruption. Therefore, it is possible to prevent the time required for measuring the insulation resistance (Rm) of the multiple motors (M) from becoming longer than necessary.

The converter unit (14) may include a rectifier circuit (Re) configured to rectify an AC voltage supplied from the AC power supply (12) through the first switch (SW1) to thereby obtain a DC voltage, and a capacitor (Ca) configured to smooth the DC voltage obtained by the rectifier circuit (Re). The inverter unit (16) may include upper arm semiconductor switching elements (S) configured to connect the positive terminal of the capacitor (Ca) with motor coils (Cu, Cv, Cw) of the motor (M) and lower arm semiconductor switching elements (S) configured to connect the negative terminal of the capacitor (Ca) with the motor coils (Cu, Cv, Cw), and may be configured to drive the motor (M) by converting the capacitor voltage (Vc) across the capacitor (Ca) into an AC voltage by switching operation of the upper arm semiconductor switching elements (S) and the lower arm semiconductor switching elements (S). The motor driving device (10) may include a second switch (SW2) configured to connect one terminal (a first terminal) of the positive terminal and the negative terminal of the capacitor (Ca) to the ground, a first detector (18) configured to detect a ground-referenced current (Im) flowing between the one terminal of the capacitor (Ca) and the ground, or a ground-referenced voltage (Vm) between the one terminal of the capacitor (Ca) and the ground, and a second detector (20) configured to detect the capacitor voltage (Vc) across the capacitor (Ca). The insulation resistance measuring step may include: a measurement target selecting step of sequentially selecting one motor (M) from among the multiple motors (M), as the measurement target motor; a switch control step of setting up a measurement state for enabling the measurement of the insulation resistance (Rm) of the measurement target motor (M) by turning off the upper arm semiconductor switching elements (S) and the lower arm semiconductor switching elements (S) of each of the multiple inverter units (16) to thereby stop operation of the multiple motors (M), turning off the first switch (SW1) and turning on the second switch (SW2), and then turning on a semiconductor switching element (S) that is connected to another terminal of the capacitor (Ca), among the upper arm and lower arm semiconductor switching elements (S) to which the motor coils (Cu, Cv, Cw) of the measurement target motor (M) are connected; and an insulation resistance calculating step of, in the measurement state, calculating the insulation resistance (Rm) of the measurement target motor (M), based on the ground-referenced current (Im) or the ground-referenced voltage (Vm) detected by the first detector (18), and the capacitor voltage (Vc) detected by the second detector (20). With this configuration, the calculation accuracy (measurement accuracy) of the insulation resistance (Rm) is improved.

The measurement interrupting step may determine that the measurement interrupt condition is established if the capacitor voltage (Vc) detected by the second detector (20) becomes equal to or lower than a predetermined voltage limit value (Vp). If the measurement is continued even after the capacitor voltage (Vc) has become equal to or lower than the predetermined voltage limit value (Vp), the insulation resistance (Rm) becomes less able to be correctly measured, and the measurement time (Tm) of the insulation resistance (Rm) of the multiple motors (M) becomes longer. In this configuration, this kind of problem will not occur.

The measurement interrupting step may determine that the measurement interrupt condition is established if the time of measurement of the insulation resistance (Rm) exceeds a predetermined time limit (Tp). This configuration makes it possible to interrupt measurement when the measurement time (Tm) becomes longer than the predetermined time limit (Tp). Thus, this meets the operator's demand that too long measurement should not be done if the measurement time (Tm) becomes too long. When measurement is interrupted due to a long measurement time (Tm), if the insulation resistance (Rm) is correctly measured, the operator can recognize that the measurement time (Tm) becomes long due to a large parasitic capacitance (Cs) of the motor (M), not because of device malfunction.

The measuring method may further include a parasitic capacitance estimating step of estimating parasitic capacitance (Cs) of all the motors (M) connected to the motor driving device (10), based on the number of the motors (M) whose insulation resistance (Rm) had been already measured before the measurement of the insulation resistance (Rm) was interrupted at the measurement interrupting step, the measured values of insulation resistance (Rm), and the measurement time (Tm) until the interruption of the measurement of the insulation resistance (Rm). This configuration enables estimation of the parasitic capacitance (Cs) of all the motors (M) when the measurement is interrupted.

The present invention is not particularly limited to the embodiments described above, and various modifications are possible without departing from the essence and gist of the present invention.

What is claimed is:

1. A motor driving device for driving multiple motors, comprising:
   a converter unit configured to convert an AC voltage supplied from an AC power supply via a first switch into a DC voltage;
   a plurality of inverter units configured to convert the DC voltage converted by the converter unit into an AC voltage to thereby drive the multiple motors;
   an insulation resistance measuring unit configured to sequentially select one of the multiple motors as a measurement target motor and measure an insulation resistance of the selected measurement target motor to thereby measure insulation resistance of each of the multiple motors;
   a measurement interrupting unit configured to determine whether or not a measurement interrupt condition is established, and interrupt the measurement of the insulation resistance by the insulation resistance measuring unit if the measurement interrupt condition is determined to be established;
   a storage unit configured to, when the measurement of the insulation resistance is interrupted, store information indicating the motor selected as the measurement target motor; and
   a measurement resuming unit configured to, when the measurement of the insulation resistance is resumed, cause the insulation resistance measuring unit to resume the measurement of the insulation resistance sequentially from the motor that had been selected as the measurement target motor when the measurement was interrupted, based on the information stored in the storage unit.

2. The motor driving device according to claim 1, wherein:
   the converter unit includes:
   a rectifier circuit configured to rectify an AC voltage supplied from the AC power supply through the first switch to thereby obtain a DC voltage; and
   a capacitor configured to smooth the DC voltage obtained by the rectifier circuit;
   each of the inverter units includes upper arm semiconductor switching elements configured to connect a positive terminal of the capacitor with motor coils of a corresponding one of the motors, and lower arm semiconductor switching elements configured to connect a negative terminal of the capacitor with the motor coils, and is configured to drive the corresponding motor by converting a capacitor voltage across the capacitor into an AC voltage by switching operation of the upper arm semiconductor switching elements and the lower arm semiconductor switching elements;
   the motor driving device includes:
   a second switch configured to connect one terminal of the positive terminal and the negative terminal of the capacitor to ground;
   a first detector configured to detect a ground-referenced current flowing between the one terminal of the capacitor and the ground, or a ground-referenced voltage between the one terminal of the capacitor and the ground; and
   a second detector configured to detect the capacitor voltage across the capacitor; and
   the insulation resistance measuring unit includes:
   a measurement target selector configured to sequentially select one motor from among the multiple motors, as the measurement target motor;

a switch control unit configured to set up a measurement state for enabling the measurement of the insulation resistance of the measurement target motor by turning off the upper arm semiconductor switching elements and the lower arm semiconductor switching elements of each of the multiple inverter units to thereby stop operation of the multiple motors, turning off the first switch and turning on the second switch, and then turning on a semiconductor switching element that is connected to another terminal of the capacitor, among the upper arm and lower arm semiconductor switching elements to which the motor coils of the measurement target motor are connected; and an insulation resistance calculator configured to, in the measurement state, calculate the insulation resistance of the measurement target motor, based on the ground-referenced current or the ground-referenced voltage detected by the first detector, and the capacitor voltage detected by the second detector.

3. The motor driving device according to claim 2, wherein the measurement interrupting unit determines that the measurement interrupt condition is established if the capacitor voltage detected by the second detector becomes equal to or lower than a predetermined voltage limit value.

4. The motor driving device according to claim 1, wherein the measurement interrupting unit determines that the measurement interrupt condition is established if a time of measurement by the insulation resistance measuring unit exceeds a predetermined time limit.

5. The motor driving device according to claim 1, further comprising a parasitic capacitance estimator configured to estimate parasitic capacitance of all the motors connected to the motor driving device, based on a number of the motors whose insulation resistance had been already measured before the measurement of the insulation resistance was interrupted by the measurement interrupting unit, measured values of the insulation resistance, and a measurement time until the measurement of the insulation resistance is interrupted by the measurement interrupting unit.

6. A measuring method by which a motor driving device for driving multiple motors measures insulation resistance of the motors, wherein the motor driving device includes: a converter unit configured to convert an AC voltage supplied from an AC power supply via a first switch into a DC voltage; and a plurality of inverter units configured to convert the DC voltage converted by the converter unit into an AC voltage to thereby drive the multiple motors, the measuring method comprising:

an insulation resistance measuring step of sequentially selecting one of the multiple motors as a measurement target motor and measuring the insulation resistance of the selected measurement target motor to thereby measure the insulation resistance of each of the multiple motors;

a measurement interrupting step of determining whether or not a measurement interrupt condition is established and interrupting the measurement of the insulation resistance if the measurement interrupt condition is determined to be established;

a storing step of, when the measurement of the insulation resistance is interrupted, storing information indicating the motor selected as the measurement target motor, on a storage unit; and a measurement resuming step of, when the measurement of the insulation resistance is resumed, resuming the measurement of the insulation resistance sequentially from the motor that had been selected as the measurement target motor when the measurement was interrupted, based on the information stored in the storage unit.

7. The measuring method according to claim 6, wherein:

the converter unit includes a rectifier circuit configured to rectify an AC voltage supplied from the AC power supply through the first switch to thereby obtain a DC voltage, and a capacitor configured to smooth the DC voltage obtained by the rectifier circuit;

each of the inverter units includes upper arm semiconductor switching elements configured to connect a positive terminal of the capacitor with motor coils of a corresponding one of the motors and lower arm semiconductor switching elements configured to connect a negative terminal of the capacitor with the motor coils, and is configured to drive the corresponding motor by converting a capacitor voltage across the capacitor into an AC voltage by switching operation of the upper arm semiconductor switching elements and the lower arm semiconductor switching elements;

the motor driving device includes a second switch configured to connect one terminal of the positive terminal and the negative terminal of the capacitor to ground, a first detector configured to detect a ground-referenced current flowing between the one terminal of the capacitor and the ground, or a ground-referenced voltage between the one terminal of the capacitor and the ground, and a second detector configured to detect the capacitor voltage across the capacitor; and the insulation resistance measuring step includes:

a measurement target selecting step of sequentially selecting one from among the multiple motors, as the measurement target motor;

a switch control step of setting up a measurement state for enabling the measurement of the insulation resistance of the measurement target motor by turning off the upper arm semiconductor switching elements and the lower arm semiconductor switching elements of each of the multiple inverter units to thereby stop operation of the multiple motors, turning off the first switch and turning on the second switch, and then turning on a semiconductor switching element that is connected to another terminal of the capacitor, among the upper arm and lower arm semiconductor switching elements to which the motor coils of the measurement target motor are connected; and an insulation resistance calculating step of, in the measurement state, calculating the insulation resistance of the measurement target motor, based on the ground-referenced current or the ground-referenced voltage detected by the first detector, and the capacitor voltage detected by the second detector.

8. The measuring method according to claim 7, wherein the measurement interrupting step determines that the measurement interrupt condition is established if the capacitor voltage detected by the second detector becomes equal to or lower than a predetermined voltage limit value.

9. The measuring method according to claim 6, wherein the measurement interrupting step determines that the measurement interrupt condition is established if a time of measurement of the insulation resistance exceeds a predetermined time limit.

10. The measuring method according to claim 6, further comprising a parasitic capacitance estimating step of estimating parasitic capacitance of all the motors connected to the motor driving device, based on a number of the motors whose insulation resistance had been already measured before the measurement of the insulation resistance was interrupted at the measurement interrupting step, measured values of the insulation resistance, and a measurement time until the interruption of the measurement of the insulation resistance.

* * * * *